(12) United States Patent
Tanaka

(10) Patent No.: US 9,319,055 B2
(45) Date of Patent: Apr. 19, 2016

(54) QUANTUM INTERFERENCE DEVICE, ATOMIC OSCILLATOR, ELECTRONIC DEVICE, AND MOVING OBJECT

(71) Applicant: Seiko Epson Corporation, Tokyo (JP)

(72) Inventor: Noriaki Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/571,748

(22) Filed: Dec. 16, 2014

(65) Prior Publication Data

US 2015/0180488 A1 Jun. 25, 2015

(30) Foreign Application Priority Data

Dec. 20, 2013 (JP) .................................. 2013-263492

(51) Int. Cl.
*H03L 7/26* (2006.01)
(52) U.S. Cl.
CPC ......................................... *H03L 7/26* (2013.01)
(58) Field of Classification Search
CPC .......................................................... H03L 7/26
USPC ..................................................... 331/94.1, 3
See application file for complete search history.

(56) References Cited

U.S. PATENT DOCUMENTS

2011/0057737 A1* 3/2011 Aoyama et al. .............. 331/94.1

FOREIGN PATENT DOCUMENTS

JP 2005-303641 A 10/2005

* cited by examiner

*Primary Examiner* — Joseph Chang
(74) *Attorney, Agent, or Firm* — Harness, Dickey & Pierce, P.L.C.

(57) ABSTRACT

A quantum interference device includes: a gas cell in which metal atoms are sealed; a light emitting unit which emits light to the gas cell; a light receiving unit which receives the light penetrating the gas cell and outputs a light receiving signal; an input unit which inputs the light receiving signal; a light receiving circuit which processes the light receiving signal output from the input unit; a high frequency current generation unit which is arranged with the light emitting unit in a line, and generates high frequency current; and a first output unit which outputs the high frequency current output from the high frequency current generation unit to the light emitting unit, in which the gas cell is disposed between the input unit and the first output unit.

8 Claims, 9 Drawing Sheets

QUANTUM INTERFERENCE DEVICE, ATOMIC OSCILLATOR, ELECTRONIC DEVICE, AND MOVING OBJECT

BACKGROUND

1. Technical Field

The present invention relates to a quantum interference device, an atomic oscillator, an electronic device, and a moving object.

2. Related Art

As an oscillator having oscillation characteristics with high accuracy in the long term, an atomic oscillator which oscillates based on atomic energy transfer of an alkaline metal such as rubidium or cesium has been known (for example, see JP-A-2005-303641).

In general, the operating principle of the atomic oscillator is broadly divided into a system using a double resonance phenomenon with light or microwaves, and a system using a quantum interference effect (coherent population trapping: CPT) with two kinds of light beams having different wavelengths, and recently, the atomic oscillator using the quantum interference effect is expected to be mounted on various devices, since the oscillator can be miniaturized more than the oscillator using the double resonance phenomenon.

The atomic oscillator using the quantum interference effect, for example, includes a gas cell in which gaseous metal atoms are sealed, a semiconductor laser which emits laser light having two kinds of resonance light beams having different frequencies to metal atoms in the gas cell, and a photodetector which detects laser light penetrating the gas cell. In such an atomic oscillator, when a difference in the frequencies of the two kinds of resonance light beams is a specific value, an electromagnetically induced transparency (EIT) phenomenon in which both of the two kinds of resonance light beams are not absorbed into but penetrate the metal atoms in the gas cell occurs, but an EIT signal (atomic resonance signal) which is a sharp signal generated with the EIT phenomenon is detected by the photodetector.

Herein, JP-A-2005-303641 discloses electrical connection of functional blocks of the atomic oscillator.

However, since JP-A-2005-303641 does not disclose a position relationship between the gas cell and the functional blocks, an SN ratio of the EIT signal decreases depending on this position relationship, and an accuracy of an oscillation frequency of the atomic oscillator decreases.

SUMMARY

An advantage of some aspects of the invention is to provide a quantum interference device and an atomic oscillator which can improve an SN ratio of an EIT signal, and to provide an electronic device and a moving object including the quantum interference device with excellent reliability.

The invention can be implemented as the following forms or application examples.

Application Example 1

This application example is directed to a quantum interference device including: a gas cell in which metal atoms are sealed; a light emitting unit which emits light to the gas cell; a light receiving unit which receives the light penetrating the gas cell and outputs a light receiving signal; an input unit which inputs the light receiving signal; a light receiving circuit which processes the light receiving signal output from the input unit; a high frequency current generation unit which is arranged with the light emitting unit in a line, and generates high frequency current; and a first output unit which outputs the high frequency current output from the high frequency current generation unit to the light emitting unit, in which the gas cell is disposed between the input unit and the first output unit.

With this configuration, it is possible to decrease a length of a wire between the input unit and the light receiving unit, to decrease an amount of noise mixed with the light receiving signal, to decrease a length of a wire between the first output unit and the light emitting unit, and to decrease an attenuation amount of the high frequency current, and accordingly, it is possible to improve an SN ratio of an EIT signal, and to reliably detect the EIT signal. Therefore, it is possible to provide a quantum interference device with high accuracy.

Application Example 2

In the quantum interference device according to the application example, it is preferable that the quantum interference device further includes: a bias current generation unit which is arranged with the light emitting unit in a line, and generates bias current to be supplied to the light emitting unit; and a second output unit which outputs the bias current output from the bias current generation unit to the light emitting unit, and the gas cell is disposed between the input unit and the second output unit.

With this configuration, it is possible to decrease a length of a wire between the second output unit and the light emitting unit and to decrease an amount of noise mixed with the bias current, and accordingly, it is possible to improve the SN ratio of the EIT signal.

Application Example 3

In the quantum interference device according to the application example, it is preferable that the high frequency current generation unit is deviated from a linear line connecting the gas cell and the light emitting unit.

With this configuration, it is possible to decrease a dimension of the device in a direction of the linear line and to realize miniaturization, compared to a case where the high frequency current generation unit is disposed on the linear line.

Application Example 4

In the quantum interference device according to the application example, it is preferable that the high frequency current generation unit and the gas cell are arranged in a line.

With this configuration, it is possible to realize miniaturization.

Application Example 5

In the quantum interference device according to the application example, it is preferable that the first output unit is arranged in a direction in which the gas cell and the light emitting unit are arranged in a line, and disposed on the light emitting unit side with respect to the high frequency current generation unit.

With this configuration, it is possible to realize miniaturization.

Application Example 6

This application example is directed to an atomic oscillator including the quantum interference device according to the application example.

With this configuration, it is possible to decrease a length of a wire between the input unit and the light receiving unit, to decrease an amount of noise mixed with the light receiving signal, to decrease a length of a wire between the first output unit and the light emitting unit and to decrease an attenuation amount of the high frequency current, and accordingly, it is possible to improve an SN ratio of an EIT signal, and to reliably detect the EIT signal. Therefore, it is possible to provide a quantum interference device with high accuracy.

Application Example 7

This application example is directed to an electronic device including the quantum interference device according to the application example.

With this configuration, it is possible to provide an electronic device having excellent reliability.

Application Example 8

This application example is directed to a moving object including the quantum interference device according to the application example.

With this configuration, it is possible to provide a moving object having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, an electronic device, and a moving object according to the invention will be described in detail with reference to embodiments shown in the accompanying drawings.

1. Atomic Oscillator (Quantum Interference Device)

First, the atomic oscillator according to the invention (atomic oscillator including the quantum interference device according to the invention) will be described. Hereinafter, an example in which the quantum interference device according to the invention is applied to the atomic oscillator will be described, but there is no limitation, and the quantum interference device according to the invention can also be applied to, for example, a magnetic sensor, a quantum memory, or the like, in addition to the atomic oscillator.

Embodiment

Figure 1:
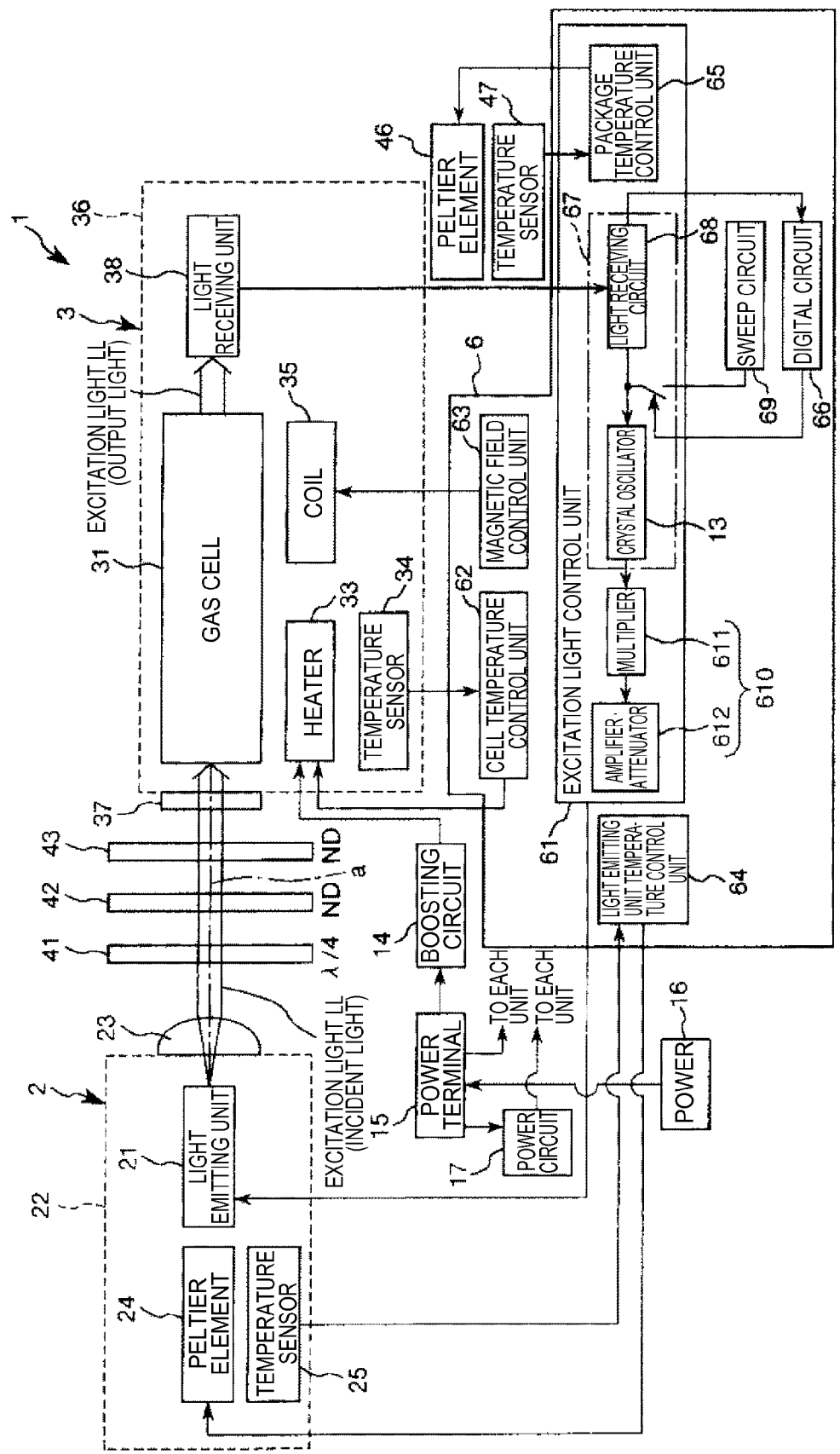
FIG. 1 is a schematic view showing a schematic configuration of an atomic oscillator according to an embodiment of the invention.
Figure 2:
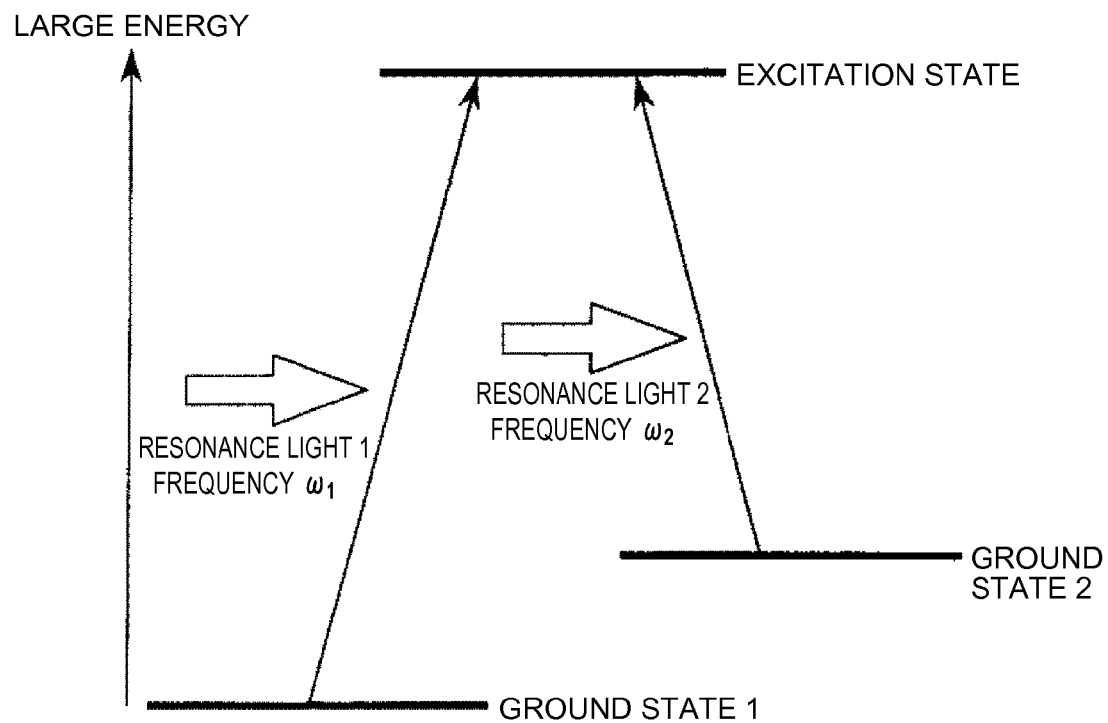
FIG. 2 is a diagram illustrating an energy state of an alkaline metal.
Figure 3:
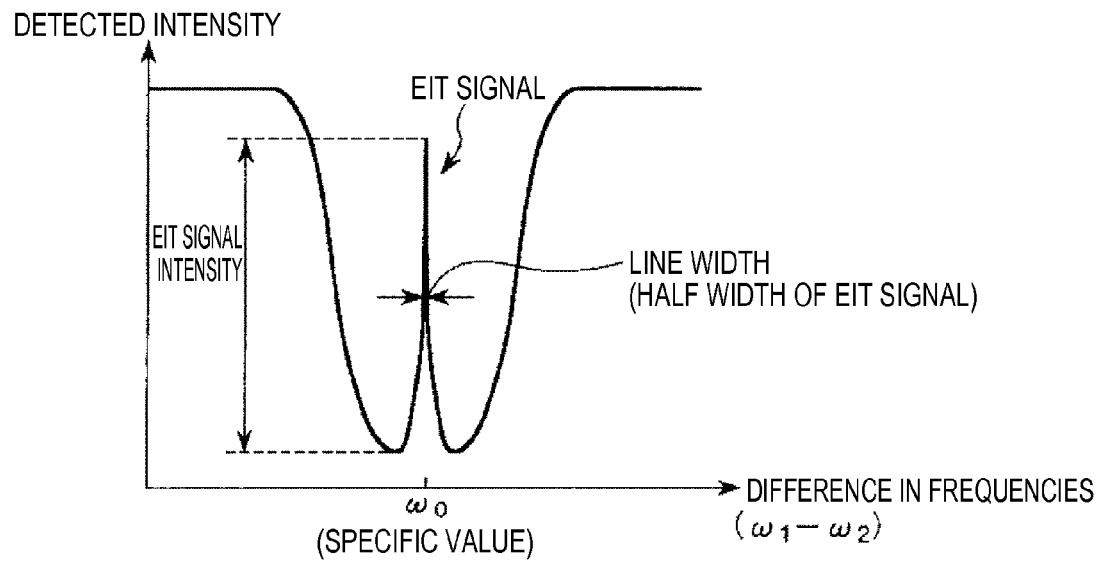
FIG. 3 is a graph showing a relationship between a difference in frequencies of two light beams emitted from a light emitting unit and intensity of light detected by a light receiving unit and a light receiving circuit.

FIG. 1 is a schematic view showing a schematic configuration of an atomic oscillator according to a first embodiment of the invention. FIG. 2 is a diagram illustrating an energy state of an alkaline metal, and FIG. 3 is a graph showing a relationship between a difference in frequencies of two light beams emitted from a light emitting unit and intensity of light detected by a light receiving unit and a light receiving circuit.

An atomic oscillator 1 shown in FIG. 1 is an atomic oscillator using a quantum interference effect.

Figure 4:
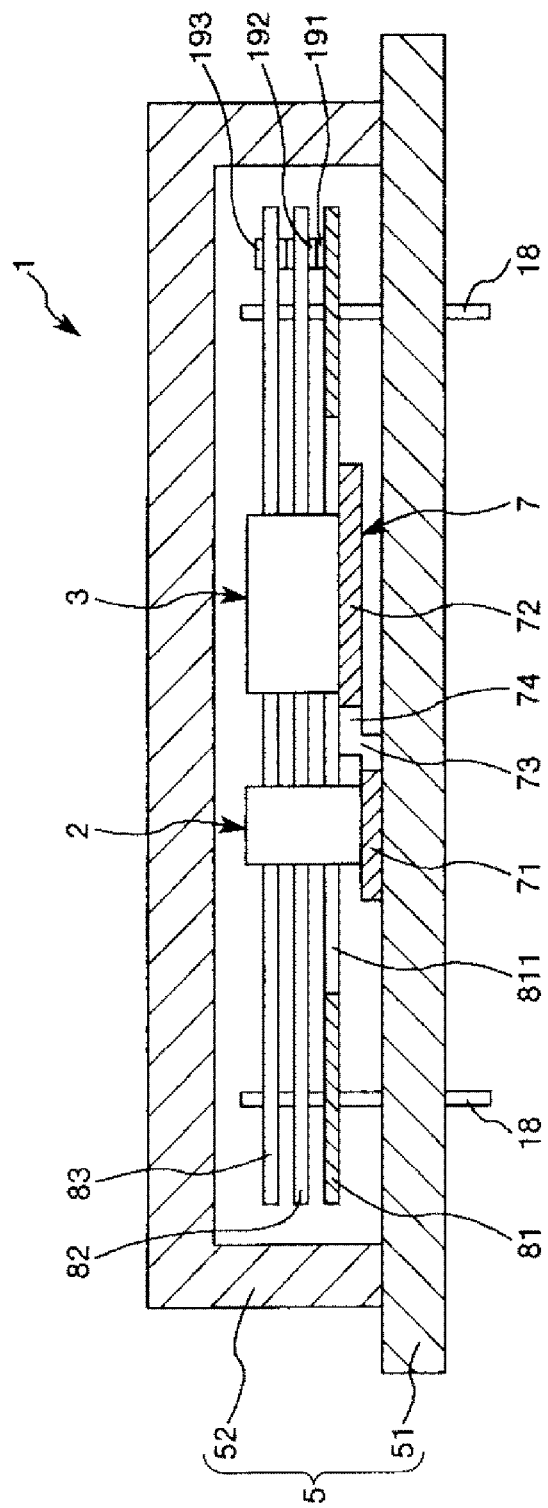
FIG. 4 is a cross-sectional view of the atomic oscillator shown in FIG. 1.

As shown in FIG. 1 and FIG. 4, the atomic oscillator 1 includes a first unit 2 which is a unit at a light emission side, a second unit 3 which is a unit at a light detection side, optical components 41, 42, and 43 provided between the units 2 and 3, a Peltier element 46, a temperature sensor 47, a control unit 6 which controls the first unit 2, the second unit 3, and the Peltier element 46, a first substrate 81, a second substrate 82, a third substrate 83, a support plate (connection member) 7, and an external package 5 containing these elements.

Herein, the first unit 2 includes a light emitting unit 21, a Peltier element 24, a temperature sensor 25, and a first package 22 containing these elements.

The second unit 3 includes a gas cell 31, a light receiving unit 38, a heater (heating unit) 33, a temperature sensor 34, a coil 35, and a second package (housing) 36 containing these elements. The Peltier element 46 and the temperature sensor 47 are provided in a predetermined portion of the second package 36, for example.

First, the principle of the atomic oscillator 1 will be briefly described.

As shown in FIG. 1, in the atomic oscillator 1, the light emitting unit 21 emits an excitation light LL to the gas cell 31, and the excitation light LL penetrating the gas cell 31 is detected by the light receiving unit 38 and a light receiving circuit 68.

A gaseous alkaline metal (metal atoms) is sealed in the gas cell 31. As shown in FIG. 2, the alkaline metal has an energy level with a three-level system, and three states which are two ground states (ground states 1 and 2) with different energy levels and an excitation state are introduced. Herein, the ground state 1 is an energy state which is lower than the ground state 2.

The excitation light LL emitted from the light emitting unit 21 includes two kinds of resonance light beams 1 and 2 having different frequencies. When the two kinds of resonance light beams 1 and 2 are emitted to the gaseous alkaline metal described above, light absorptance (light transmittance) of the resonance light beams 1 and 2 with respect to the alkaline metal changes, according to a difference between a frequency $\omega_1$ of the resonance light 1 and a frequency $\omega_2$ of the resonance light 2 ($\omega_1-\omega_2$).

When the difference between the frequency $\omega_1$ of the resonance light 1 and the frequency $\omega_2$ of the resonance light 2 ($\omega_1-\omega_2$) coincides with a frequency equivalent to an energy difference between the ground state 1 and the ground state 2, excitation from the respective ground states 1 and 2 to the excitation state is stopped. At that time, both of the resonance light beams 1 and 2 are not absorbed into but penetrate the alkaline metal. Such a phenomenon is referred to as a CPT phenomenon or an electromagnetically induced transparency (EIT) phenomenon.

For example, when the light emitting unit 21 fixes the frequency ω1 of the resonance light 1 and changes the frequency ω2 of the resonance light 2 and the difference between the frequency ω1 of the resonance light 1 and the frequency ω2 of the resonance light 2 (ω1−ω2) coincides with a frequency ω0 equivalent to the energy difference between the ground state 1 and the ground state 2, detection intensity of the light receiving unit 38 and the light receiving circuit 68 sharply increases, as shown in FIG. 3. Such a sharp signal is detected as an EIT signal (atomic resonance signal). The EIT signal has an eigenvalue determined depending on the kinds of alkaline metal. Accordingly, the oscillator can be configured using the EIT signal.

Hereinafter, a specific configuration of the atomic oscillator 1 according to the embodiment will be described.

Figure 5:
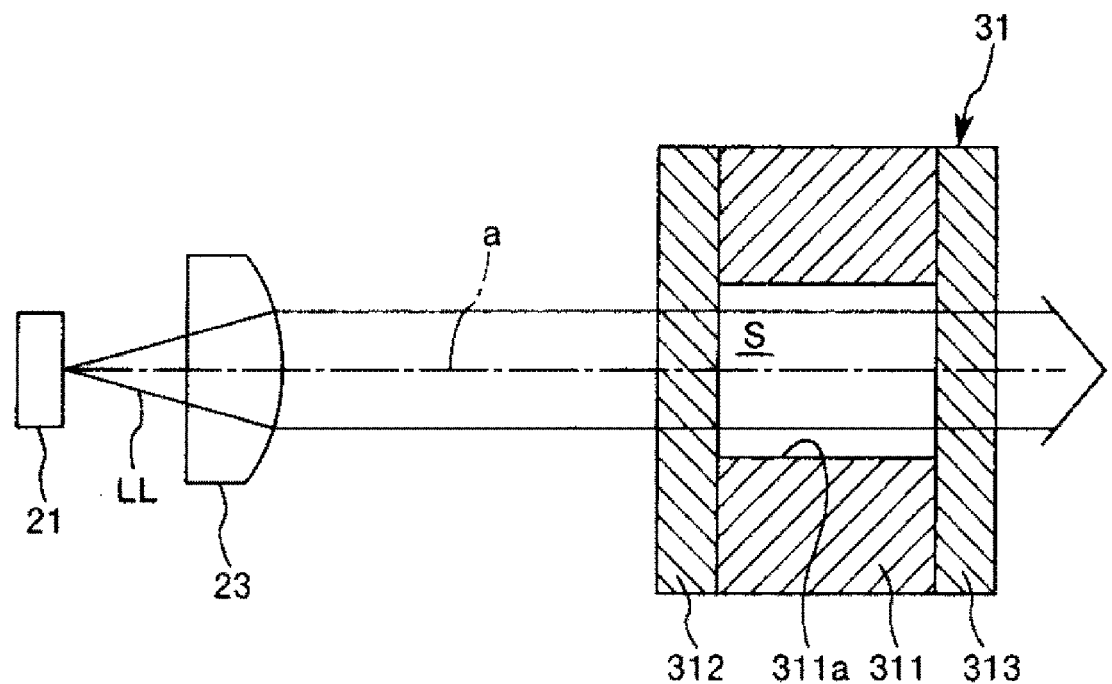
FIG. 5 is a schematic view illustrating a light emitting unit and a gas cell included in the atomic oscillator shown in FIG. 1.
Figure 6:
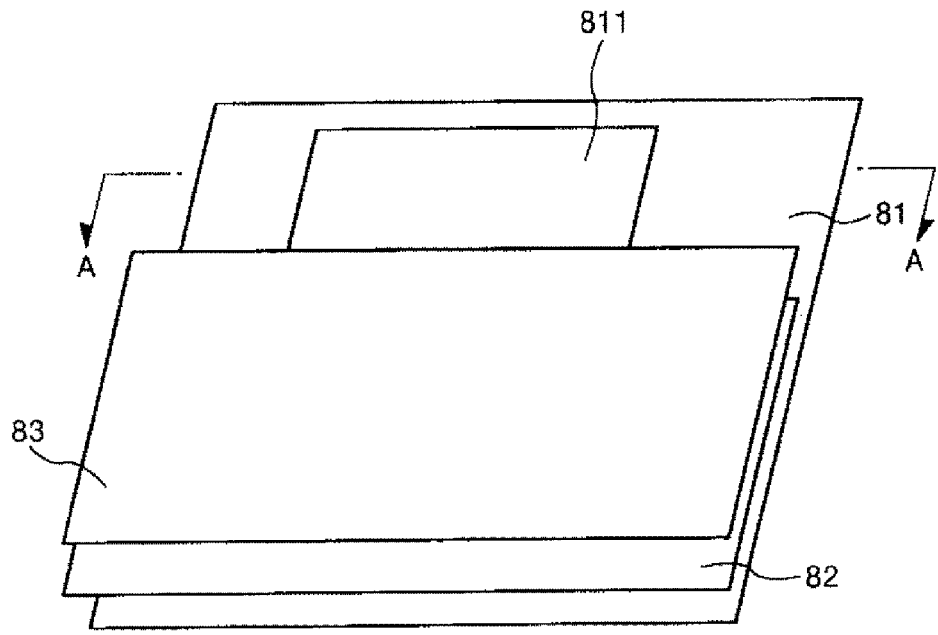
FIG. 6 is a perspective view showing a first substrate, a second substrate, and a third substrate included in the atomic oscillator shown in FIG. 1.
Figure 7:
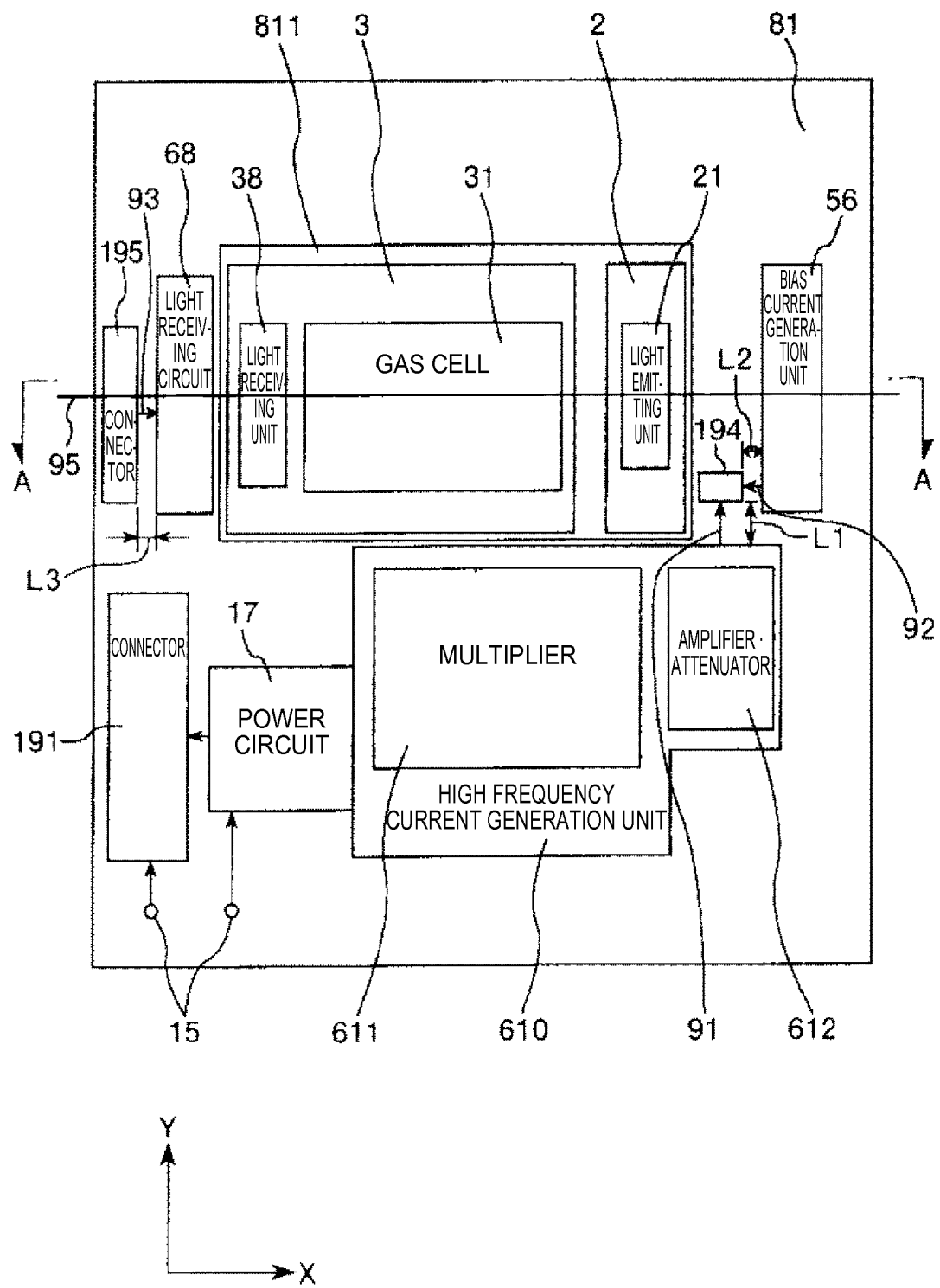
FIG. 7 is a plan view (including block diagram) showing a first unit, a second unit, a first substrate, and units provided on the first substrate, included in the atomic oscillator shown in FIG. 1.

FIG. 4 is a cross-sectional view of the atomic oscillator shown in FIG. 1, FIG. 5 is a schematic view illustrating the light emitting unit and the gas cell included in the atomic oscillator shown in FIG. 1, FIG. 6 is a perspective view showing a first substrate, a second substrate, and a third substrate included in the atomic oscillator shown in FIG. 1, and FIG. 7 is a plan view (including block diagram) showing the first unit, the second unit, the first substrate, and units provided on the first substrate, included in the atomic oscillator shown in FIG. 1. The cross section of FIG. 4 is a cross section taken along line A-A of FIG. 6 and FIG. 7. Hereinafter, for the sake of convenience, the upper side in FIGS. 4 to 6 is referred to as an "upper portion" and the lower side thereof is referred to as a "lower portion". In FIG. 7, for the sake of convenience, an X axis and a Y axis are shown as two axes orthogonal to each other, and a distal side of each arrow shown in the drawing is set as a "positive side" and a proximal side thereof is set as a "negative side". Hereinafter, for the sake of convenience, a direction parallel to the X axis is referred to as an "X axis direction", a direction parallel with the Y axis is referred to as a "Y axis direction", the positive Y direction side (upper side in FIG. 7) is referred to as an "upper portion", and the negative Y direction side (lower side in FIG. 7) is referred to as an "lower portion". The X axis direction is a direction parallel with an axis a of the excitation light LL, and the X axis direction is a direction orthogonal to the axis a of the excitation light LL or a direction parallel with the direction orthogonal to the axis a of the excitation light LL. FIG. 7 shows only a part of wires with an arrow.

As shown in FIG. 1 and FIG. 4, the atomic oscillator 1 includes the first substrate 81, the second substrate 82, and the third substrate 83 on which the control unit 6 is separately mounted, and the support plate 7 which supports the first unit 2 and the second unit 3 by the same surface side.

The first unit 2, the second unit 3, the Peltier element 46, and the temperature sensor 47 are electrically connected to the control unit 6 through wires (not shown) of the first substrate 81, the second substrate 82, and the third substrate 83, a flexible connector (not shown), and a connector (not shown) provided on the first substrate 81, the second substrate 82, and the third substrate 83. The first unit 2, the second unit 3, and the Peltier element 46 are driven and controlled by the control unit 6.

Hereinafter, each unit of the atomic oscillator 1 will be sequentially described in detail.
First Unit As described above, the first unit 2 includes the light emitting unit 21, the Peltier element 24, the temperature sensor 25, and the first package 22 containing these elements.
Light Emitting Unit The light emitting unit 21 has a function of emitting the excitation light LL which excites the alkaline metal atoms in the gas cell 31.

More specifically, the light emitting unit 21 emits light including two kinds of light beams (resonance light 1 and resonance light 2) having different frequencies as described above, as the excitation light LL.

The frequency ω1 of the resonance light 1 allows the alkaline metal in the gas cell 31 to excite (resonate) from the ground state 1 to the excitation state described above.

The frequency ω2 of the resonance light 2 allows the alkaline metal in the gas cell 31 to excite (resonate) from the ground state 2 to the excitation state described above.

The light emitting unit 21 is not particularly limited as long as it can emit the excitation light LL described above, and a semiconductor laser such as a vertical cavity surface emitting laser (VCSEL) can be used, for example.
Peltier Element The Peltier element (temperature adjusting element) 24 has a function of heating and cooling the light emitting unit 21. Accordingly, the temperature of the light emitting unit 21 is adjusted to a predetermined temperature. The temperature adjusting element for adjusting the temperature of the light emitting unit 21 is not limited to the Peltier element 24, and a heating resistor (heater) or the like is used, for example.

The Peltier element 24 is electrically connected to a light emitting unit temperature control unit 64 of the control unit 6 which will be described later, and is electrically controlled.
Temperature Sensor The temperature sensor 25 detects the temperature of the light emitting unit 21. The driving of the Peltier element 24 described above is controlled based on the detected result of the temperature sensor 25. Accordingly, it is possible to maintain the temperature of the light emitting unit 21 at a desirable temperature.

An installation position of the temperature sensor 25 is not particularly limited, and an upper portion of an outer surface of the light emitting unit 21 is used.

The temperature sensor 25 is not particularly limited, and various well-known temperature sensors such as a thermistor or a thermocouple can be used.

The temperature sensor 25 is electrically connected to the light emitting unit temperature control unit 64 of the control unit 6 which will be described later.
First Package The first package 22 contains the light emitting unit 21, the Peltier element 24, and the temperature sensor 25 described above.

The first package 22 includes a housing having a block-like external shape and forms a box shape. The first package 22 is mounted on the support plate 7 which is fixed (connected) to a base plate 51 (see FIG. 4) of the external package 5.

In addition, the first package 22 directly or indirectly supports the light emitting unit 21, the Peltier element 24, and the temperature sensor 25 from the inside thereof.

For example, a plurality of leads (not shown) are protruded from the first package 22, and these are electrically connected to the light emitting unit 21, the Peltier element 24, and the temperature sensor 25 through the wires. Each lead is electrically connected to a predetermined substrate of the first substrate 81, the second substrate 82, and the third substrate 83 through a connector (not shown). As this connector, a flexible substrate or an element having a socket shape can be used, for example.

A window portion 23 is provided on a wall of the first package 22 on the second unit 3 side. This window portion 23 is provided on an optical axis (axis a of excitation light LL) between the gas cell 31 and the light emitting unit 21. The window portion 23 has permeability with respect to the excitation light LL.

In the embodiment, the window portion 23 is a lens. Accordingly, the excitation light LL can be emitted to the gas cell 31 without any waste. In addition, the window portion 23 has a function of setting the excitation light LL as parallel light. That is, the window portion 23 is a collimating lens, and the excitation light LL in an internal space S is parallel light. Accordingly, among the alkaline metal atoms existing in the internal space S, it is possible to increase the number of alkaline metal atoms resonating by the excitation light LL emitted from the light emitting unit 21. As a result, it is possible to increase the intensity of the EIT signal.

The window portion 23 is not limited to a lens, as long as it has permeability with respect to the excitation light LL, and an optical component other than a lens may be used, or a simple plate-shaped member having optical transparency may be used, for example. In this case, the lens having such a function may be, for example, provided between the first package 22 and the second package 36, in the same manner as that of the optical components 41, 42, and 43 which will be described later.

The configuration material in a portion of the first package 22 other than the window portion 23 is not particularly limited, and ceramics, metals, or resins can be used, for example.

Herein, in a case where the portion of the first package 22 other than the window portion 23 is configured with a material having permeability with respect to the excitation light, the portion of the first package 22 other than the window portion 23 and the window portion 23 can be integrally formed. In a case where the portion of the first package 22 other than the window portion 23 is configured with a material not having permeability with respect to the excitation light, the portion of the first package 22 other than the window portion 23 and the window portion 23 are separately formed, and may be bonded to each other by a well-known bonding method.

The inside of the first package 22 is preferably an airtight space. Accordingly, the inside of the first package 22 can be a reduced-pressure state or an inert gas sealed state, and as a result, it is possible to improve properties of the atomic oscillator 1.

According to the first package 22, it is possible to allow the emission of the excitation light from the light emitting unit 21 to the outside of the first package 22, and to contain the light emitting unit 21, the Peltier element 24, and the temperature sensor 25 in the first package 22.

Second Unit

As described above, the second unit 3 includes the gas cell 31, the light receiving unit 38, the heater 33, the temperature sensor 34, the coil 35, and the second package 36 containing these elements.

Gas Cell

The alkaline metal such as gaseous rubidium, cesium, or sodium is sealed in the gas cell 31. In addition, noble gas such as argon or neon, or inert gas such as nitrogen may be sealed in the gas cell 31 as buffer gas, if necessary, with the alkaline metal gas.

For example, as shown in FIG. 5, the gas cell 31 includes a main body portion 311 including a columnar penetration hole 311a, and a pair of window portions 312 and 313 which blocks both openings of the penetration hole 311a. Accordingly, the internal space S described above with the alkaline metal sealed therein is formed.

The material configuring the main body portion 311 is not particularly limited, and a metal material, a resin material, a glass material, a silicon material, or a quartz crystal is used, but the glass material and the silicon material are preferably used, from a viewpoint of workability or bonding of the window portions 312 and 313.

The window portions 312 and 313 are airtightly bonded to the main body portion 311. Accordingly, the internal space S of the gas cell 31 can be set as an airtight space.

The bonding method of the main body portion 311 and the window portions 312 and 313 is determined depending on the kinds of the configuration materials and is not particularly limited, but a bonding method using an adhesive, a direct bonding method, or an anodic bonding method can be used, for example.

The material configuring the window portions 312 and 313 is not particularly limited, as long as it has permeability with respect to the excitation light LL described above, and a silicon material, a glass material, or a quartz crystal is used, for example.

Each of the window portions 312 and 313 has permeability with respect to the excitation light LL from the light emitting unit 21 described above. The excitation light LL incident on the inside of the gas cell 31 penetrates one window portion 312, and the excitation light LL emitted from the inside of the gas cell 31 penetrates the other window portion 313.

The gas cell 31 is heated by the heater 33, and the temperature thereof is adjusted to a predetermined temperature.

Light Receiving Unit and Light Receiving Circuit

The light receiving unit 38 and the light receiving circuit 68 have a function of detecting the intensity of the excitation light LL (resonance light beams 1 and 2) penetrating the inside of the gas cell 31. In this case, the light receiving unit 38 has a function of receiving the excitation light LL penetrating the inside of the gas cell 31, that is, a function of photoelectric conversion. The light receiving circuit 68 has a function of converting a light receiving signal of the light receiving unit 38, that is, current output from the light receiving unit 38 into a voltage and amplifying the voltage. That is, the light receiving circuit 68 includes a current-voltage conversion circuit (IV conversion circuit) which converts the current into the voltage.

The light receiving unit 38 is not particularly limited, as long as it can receive the excitation light LL described above, and a photodetector (light receiving element) such as a solar cell or a photodiode can be used, for example.

Herein, as shown in FIG. 7, a connector 195 is installed on the first substrate 81, and the connector 195 and the light receiving unit 38 are electrically connected to each other by a flexible connector (not shown). The connector 195 and the light receiving circuit 68 are electrically connected to each other by a wire 93 of the first substrate 81. The connector 195 is an input unit to which the light receiving signal of the light receiving unit 38 is input, and the light receiving signal input from the connector 195 is subjected to a process in the light receiving circuit 68 as will be described later.

Heater

The heater 33 has a function of heating the gas cell 31 described above (more specifically, alkaline metal in the gas cell 31). Accordingly, it is possible to maintain the alkaline metal in the gas cell 31 in a gaseous state with a desirable concentration.

The heater 33 is driven by the supply of the power, that is, performs heating by electrical connection, and is configured with a heating resistor provided on an outer surface of the gas cell 31, for example. The heating resistor is formed using a chemical vapor deposition method (CVD) such as plasma CVD or thermal CVD, a dry plating method such as vacuum vapor deposition, or a sol-gel method.

Herein, when the heating resistor is provided on an incident portion or an emitting portion of the excitation light LL on the gas cell 31, the heating resistor is configured with a material having permeability with respect to the excitation light, specifically, a transparent electrode material such as oxides such as indium tin oxide (ITO), indium zinc oxide (IZO), $In_2O_3$, $SnO_2$, Sb-containing $SnO_2$, or Al-containing ZnO, for example.

The heater 33 is not particularly limited, as long as it can heat the gas cell 31, and may not come in contact with the gas cell 31. The gas cell 31 may be heated using the Peltier element, instead of the heater 33, or in combination use with the heater 33.

The heater 33 is electrically connected to a cell temperature control unit 62 of the control unit 6 which will be described later, and is electrically controlled.

Temperature Sensor

The temperature sensor 34 detects the temperature of the heater 33 or the gas cell 31. The amount of heat generation of the heater 33 described above is controlled, based on the detected result of the temperature sensor 34. Accordingly, it is possible to maintain the temperature of the alkaline metal atoms in the gas cell 31 at a desirable temperature.

An installation position of the temperature sensor 34 is not particularly limited, and an upper portion of the heater 33, or an upper portion of the outer surface of the gas cell 31 may be used.

The temperature sensor 34 is not particularly limited, and various well-known temperature sensors such as a thermistor or a thermocouple can be used.

The temperature sensor 34 is electrically connected to the cell temperature control unit 62 of the control unit 6 which will be described later.

Coil

The coil 35 has a function of generating a magnetic field in a direction (parallel direction) along the axis a of the excitation light LL in the internal space S, by electrical connection. Accordingly, it is possible to improve resolution by widening a gap between different degenerated energy levels of the alkaline metal atoms existing in the internal space S due to Zeeman splitting, and to decrease a line width of the EIT signal. As a result, it is possible to increase an accuracy of an oscillation frequency of the atomic oscillator 1.

The magnetic field generated by the coil 35 may be any magnetic field such as a DC magnetic field or an AC magnetic field, or may be a magnetic field where a DC magnetic field and an AC magnetic field are superimposed onto each other.

An installation position of the coil 35 is not particularly limited and is not shown. The coil may be provided to be wound along an outer periphery of the gas cell 31 so as to have a solenoid type configuration, or the pair of coils may face each other with the gas cell 31 interposed therebetween so as to have a Helmholtz type configuration.

The coil 35 is electrically connected to a magnetic field control unit 63 of the control unit 6 which will be described later, through a wire (not shown). Accordingly, it is possible to perform the electrical connection with respect to the coil 35.

Second Package

The second package 36 contains the gas cell 31, the light receiving unit 38, the heater 33, the temperature sensor 34, and the coil 35 described above.

The second package 36 includes a housing having a block-like external shape and forms a box shape. The second package 36 is mounted on the support plate 7 which is fixed (connected) to the base plate 51 (see FIG. 4) of the external package 5.

In addition, the second package 36 directly or indirectly supports the gas cell 31, the light receiving unit 38, the heater 33, the temperature sensor 34, and the coil 35 from the inside thereof.

For example, a plurality of leads (not shown) are protruded from the second package 36, and these are electrically connected to the gas cell 31, the light receiving unit 38, the heater 33, the temperature sensor 34, and the coil 35 through the wires. Each lead is electrically connected to a predetermined substrate of the first substrate 81, the second substrate 82, and the third substrate 83 through a connector (not shown). As this connector, a flexible substrate or an element having a socket shape can be used, for example.

A window portion 37 is provided on a wall of the second package 36 on the first unit 2 side. This window portion 37 is provided on an optical axis (axis a) between the gas cell 31 and the light emitting unit 21. The window portion 37 has permeability with respect to the excitation light LL.

The window portion 37 is not limited to have optical transparency, as long as it has permeability with respect to the excitation light, and for example, may be an optical component such as a lens, a polarizing plate, or a λ/4 wavelength plate.

The configuration material in a portion of the second package 36 other than the window portion 37 is not particularly limited, and ceramics, metals, or resins can be used, for example.

Peltier Element and Temperature Sensor

Peltier Element

The Peltier element (temperature adjusting element) 46 has a function of heating and cooling the second package 36. Accordingly, the temperature of the second package 36 is adjusted to a predetermined temperature. The temperature adjusting element for adjusting the temperature of the second package 36 is not limited to the Peltier element 46, and a heating resistor (heater) or the like is used, for example.

The Peltier element 46 is electrically connected to a package temperature control unit 65 of the control unit 6 which will be described later, and is electrically controlled.

Temperature Sensor

The temperature sensor 47 detects the inside temperature of the second package 36. The driving of the Peltier element 46 described above is controlled based on the detected result of the temperature sensor 47. Accordingly, it is possible to maintain the temperature of the second package 36 at a desirable temperature.

An installation position of the temperature sensor 47 is not particularly limited, and an upper portion of an outer surface of the second package 36 is used, for example.

The temperature sensor 47 is not particularly limited, and various well-known temperature sensors such as a thermistor or a thermocouple can be used.

The temperature sensor 47 is electrically connected to the package temperature control unit 65 of the control unit 6 which will be described later.

Optical Component

The plurality of optical components 41, 42, and 43 are disposed between the first package 22 and the second package 36. The plurality of optical components 41, 42, and 43 are provided on the optical axis (axis a) between the light emitting unit 21 in the first package 22 described above and the gas cell 31 in the second package 36 described above.

In the embodiment, the optical components 41, 42, and 43 are disposed in this order, from the first package 22 side to the second package 36 side. The optical components 41, 42, and 43 are installed on the base plate 51 (see FIG. 4) of the external package 5. As a method of holding the optical components 41, 42, and 43, a method of providing three recesses on the base plate 51 and inserting the optical components 41, 42, and 43 into respective recesses is used, for example.

The optical component 41 is a λ/4 wavelength plate. Accordingly, when the excitation light from the light emitting unit 21 is linear polarized light, for example, it is possible to convert the excitation light into circular polarized light (right circular polarized light and left circular polarized light).

As described above, in a state where the alkaline metal atoms in the gas cell 31 are subjected to Zeeman splitting due to the magnetic field of the coil 35, when the linear polarized excitation light is emitted to the alkaline metal atoms, the alkaline metal atoms separately exist evenly in the plurality of levels where the alkaline metal atoms are subjected to Zeeman splitting, due to an interaction between the excitation light and alkaline metal atoms. As a result, since the number of alkaline metal atoms in a desirable energy level is relatively smaller than the number of alkaline metal atoms in the other energy level, the number of atoms for realizing the desirable EIT phenomenon is decreased, the desirable EIT signal is decreased, and as a result, oscillation characteristics of the atomic oscillator 1 are degraded.

Meanwhile, as described above, in a state where the alkaline metal atoms in the gas cell 31 are subjected to Zeeman splitting due to the magnetic field of the coil 35, when the circular polarized excitation light is emitted to the alkaline metal atoms, it is possible to relatively increase the number of alkaline metal atoms in a desirable energy level to be relatively greater than the number of alkaline metal atoms in the other energy level, among the plurality of levels where the alkaline metal atoms are subjected to Zeeman splitting, due to an interaction between the excitation light and alkaline metal atoms. Accordingly, the number of atoms for realizing the desirable EIT phenomenon is increased, the desirable EIT signal is increased, and as a result, oscillation characteristics of the atomic oscillator 1 can be improved.

In the embodiment, the optical component 41 has a circular disk shape. Accordingly, it is possible to rotate the optical component 41 around an axis line parallel with the optical axis (axis a) in a state of being engaged with a penetration hole (not shown) formed on the base plate 51 which will be described later. A shape of the optical component 41 in a plan view is not limited thereto, and may be a polygon such as a square or a pentagon, for example.

The optical components 42 and 43 are disposed on the second unit 3 side with respect to the optical component 41.

The optical components 42 and 43 are respectively neutral density filters (ND filters). Accordingly, it is possible to adjust (decrease) the intensity of the excitation light LL incident on the gas cell 31. Therefore, even when the amount of output of the light emitting unit 21 is great, it is possible to set the excitation light incident on the gas cell 31 as desirable light intensity. In the embodiment, the intensity of the excitation light converted into the circular polarized light by the optical component 41 described above is adjusted by the optical components 42 and 43.

In the embodiment, the optical components 42 and 43 respectively have a plate shape. A shape of the respective optical components 42 and 43 in a plan view is a circle. Accordingly, it is possible to rotate the optical components 42 and 43 around an axis line parallel with the optical axis (axis a) in a state of being engaged with a penetration hole (not shown) formed on the base plate 51 which will be described later.

A shape of the optical components 42 and 43 in a plan view is not limited thereto, and may be a polygon such as a square or a pentagon, for example.

The optical components 42 and 43 may have equivalent or different dimming rates.

The upper sides and the lower sides of the respective optical components 42 and 43 may have different dimming rates in a continuous or stepwise manner. In this case, it is possible to adjust the dimming rates of the excitation light by adjusting the positions of the optical components 42 and 43 in a vertical direction with respect to the external package 5.

The respective optical components 42 and 43 may have different dimming rates in a continuous or stepwise manner, in a circumferential direction. In this case, it is possible to adjust the dimming rates of the excitation light by rotating the optical components 42 and 43. In this case, the rotation centers of the optical components 42 and 43 may be deviated with respect to the axis a.

Either optical component among the optical components 42 and 43 may be omitted. In addition, when the output of the light emitting unit 21 is an appropriate amount, both of the optical components 42 and 43 can be omitted.

The kinds, the disposed order, or the number of the optical components 41, 42, and 43 are not limited. For example, the optical components 41, 42, and 43 are not limited to a λ/4 wavelength plate or a neutral density filter, and a lens or a polarizing plate may be used.

External Package

As shown in FIG. 4, the external package 5 includes the base plate (substrate) 51 which supports the support plate 7 and the optical components 41 to 43, and a cover member 52 which is provided so as to cover contained materials such as the first unit 2, the second unit 3, the first substrate 81, the second substrate 82, the third substrate 83, the support plate 7, and the optical components 41 to 43, with respect to the base plate 51. The base plate 51 and the cover member 52 are fixed to each other with an adhesive (not shown), for example.

The first substrate 81, the second substrate 82, and the third substrate 83 are separated from each other, and are held to be separated from the base plate 51 by a plurality of conductive pins 18, in a state of being arranged in a thickness direction (vertical direction in FIG. 4) thereof.

Each conductive pin 18 penetrates the base plate 51 and is protruded to the outside of the external package 5, and electrically connects the external portion, and the first substrate 81, the second substrate 82, and the third substrate 83, directly or indirectly by the protruded portion.

The configuration material of the external package is not particularly limited, and ceramics, metals, or resins can be used, for example.

Support Plate

As shown in FIG. 4, the support plate 7 includes a first plate portion 71 which supports the first unit 2, a second plate portion 72 which supports the second unit 3, and a pair of connection portions 73 which connect the first plate portion 71 and the second plate portion 72 to each other. The second plate portion 72 is positioned at the upper portion with respect to the first plate portion 71, that is, at the second unit 3 side. Since a penetration hole 74 is formed on the support plate 7, the pair of the connection portions 73 are formed. The support plate 7 is a member which supports the first unit 2 and the second unit 3 at the same surface side (upper surface side) and is mounted on (connected to) the upper portion of the base plate 51 at the lower surface side.

The upper surface of the first plate portion 71 supports the first unit 2, and the lower surface thereof is fixed to the base plate 51. The upper surface of the second plate portion 72 supports the second unit 3. The lower surface of the second plate portion 72 is separated from the base plate 51. The optical components 41, 42, and 43 are disposed in the position of the penetration hole 74.

Since the second unit 3 is separated from the base plate 51 by the support plate 7, it is possible to prevent direct heat transfer from the base plate 51 to the second unit 3. Therefore, the atomic oscillator 1 having excellent reliability is obtained.

The pair of connection portions 73 are provided to be separated from each other. Accordingly, it is possible to decrease a cross-sectional area of the connection portions 73, compared to a case where the connection portion 73 is configured with one piece of plate, for example. Therefore, as the cross-sectional area is small, it is possible to decrease quantity of heat conduction from the first plate portion 71 to the second plate portion 72. Thus, the atomic oscillator 1 having excellent reliability is obtained.

The configuration material of the support plate 7 is not particularly limited, and ceramics, metals, or resins can be used, but metals are preferable among these.

Control Unit

The control unit 6 shown in FIG. 1 has a function of controlling each of the heater 33, the coil 35, the light emitting unit 21, and the Peltier elements 24 and 46.

In the embodiment, the control unit 6 is configured with a plurality of integrated circuit (IC) chips mounted on the first substrate 81, the second substrate 82, and the third substrate 83.

As shown in FIG. 1 and FIG. 7, the control unit 6 includes a excitation light control unit (light emitting unit control unit) 61 which controls the frequencies of the resonance light beams 1 and 2 of the light emitting unit 21, the cell temperature control unit 62 which controls the temperature of the alkaline metal in the gas cell 31 (temperature of the gas cell 31), the magnetic field control unit 63 which controls the magnetic field applied to the gas cell 31, the light emitting unit temperature control unit 64 which controls the temperature of the light emitting unit 21, the package temperature control unit 65 which controls the temperature of the second package 36, a sweep circuit 69, and a bias current generation unit 56 which generates bias current to be supplied to the light emitting unit 21 and outputs the bias current to the light emitting unit 21.

The excitation light control unit 61 includes the light receiving circuit 68 which processes the light receiving signal output from the light receiving unit 38, a crystal oscillator (oscillation circuit) 13, a multiplier 611 which is electrically connected to an output terminal of the crystal oscillator, and an amplifier/attenuator 612 which is electrically connected to the multiplier 611. As the multiplier 611, a phase locked loop (PLL) synthesizer circuit or the like can be used, for example. The multiplier 611 and the amplifier/attenuator 612 configure a high frequency current generation unit 610 which generates high frequency current to be supplied to the light emitting unit 21 and outputs the high frequency current to the light emitting unit 21. In the specification, the high frequency is a frequency equal to or higher than 10 MHz.

The bias current generation unit 56 has a function of converting the voltage to the DC current. That is, the bias current generation unit 56 includes a voltage current conversion circuit (VI conversion circuit) which converts the voltage to the DC current.

Herein, the connector 194 is installed on the first substrate 81, and the connector 194 and the light emitting unit 21 are electrically connected to each other by a flexible connector (not shown). The connector 194 and the high frequency current generation unit 610 are electrically connected to each other by a wire 91 of the first substrate 81. The connector 194 and the bias current generation unit 56 are electrically connected to each other by a wire 92 of the first substrate 81.

The connector 194 is a first output unit from which the high frequency current generated by the high frequency current generation unit 610 is output, and is a second output unit from which the bias current generated by the bias current generation unit is output. The bias current and the high frequency current output from the connector 194 are transmitted to the light emitting unit 21 separately or in a synthesized manner.

The control unit 6 includes an analog circuit 67 which includes the crystal oscillator 13 and the light receiving circuit 68 and controls the EIT signal, and a digital circuit 66 which controls the analog circuit 67 and the excitation light control unit 61. Many parts (some part) of the constituent elements of the analog circuit 67 and the constituent elements of the excitation light control unit 61 are overlapped with each other.

The cell temperature control unit 62 controls the driving of the heater (heating unit) 33, that is, controls the electrical connection to the heater 33, based on the detected result of the temperature sensor 34. Accordingly, it is possible to maintain the temperature of the gas cell 31 in a range of a desirable temperature.

The magnetic field control unit 63 controls the electrical connection to the coil 35 so that the magnetic field generated by the coil 35 is constant.

The light emitting unit temperature control unit 64 controls the driving of the Peltier element 24, that is, controls the electrical connection to the Peltier element 24, based on the detected result of the temperature sensor 25. Accordingly, it is possible to maintain the temperature of the light emitting unit 21 in a range of a desirable temperature.

The package temperature control unit 65 controls the driving of the Peltier element 46, that is, controls the electrical connection to the Peltier element 46, based on the detected result of the temperature sensor 47. Accordingly, it is possible to maintain the temperature of the second package 36 in a range of a desirable temperature.

Herein, many parts of the excitation light control unit 61 and the analog circuit 67 are overlapped with each other and the excitation light control unit and the analog circuit are controlled substantially in the same manner, and accordingly, the control operation of the excitation light control unit 61 will be representatively described, hereinafter.

The excitation light control unit 61 controls the driving (EIT signal) of the light emitting unit 21, that is, controls the frequencies of the resonance light beams 1 and 2 emitted from the light emitting unit 21, based on the detected result of the light receiving unit 38 and the light receiving circuit 68. More specifically, the excitation light control unit 61 controls the frequencies of the resonance light beams 1 and 2 emitted from the light emitting unit 21 so that the difference in frequencies (ω1−ω2) becomes the alkaline metal specific frequency ω0, based on the detected result of the light receiving unit 38 and the light receiving circuit 68.

The excitation light control unit 61 synchronizes and adjusts the oscillation frequency (resonance frequency) of the crystal oscillator 13 and outputs the oscillation frequency as the output signal of the atomic oscillator 1, based on the detected result of the light receiving unit 38 and the light receiving circuit 68. It is possible to use a voltage-controlled crystal oscillator as the crystal oscillator 13, for example.

Herein, regarding the adjustment of the oscillation frequency of the crystal oscillator 13, a case where the alkaline metal specific frequency ω0 is 9.2 GHz, the oscillation frequency of the crystal oscillator 13 is maintained at 10 kHz, and the signal at 10 kHz is output as an output signal of the atomic oscillator 1, is described as a specific example.

First, the signal (frequency: 10 kHz) output from the crystal oscillator 13 is multiplied to $4.6 \times 10^5$ times (frequency: 4.6 GHz) by the multiplier 611, amplified and attenuated by the amplifier/attenuator 612, and is output as high frequency current from the amplifier/attenuator 612.

Meanwhile, the voltage is converted into the DC current and is output as the bias current by the bias current generation unit 56.

The high frequency current and the bias current are synthesized and subjected to frequency modulation, and then is supplied to the light emitting unit 21. The light emitting unit 21 is driven by the signal subjected to the frequency modulation and emits the excitation light LL described above, and the excitation light LL penetrating the inside of the gas cell 31 is received, that is, subjected to photoelectric conversion by the light receiving unit 38. The current output from the light receiving unit 38 is converted into the voltage and amplified, by the light receiving circuit 68. That is, in the light receiving unit 38 and the light receiving circuit 68, the intensity of the excitation light LL is detected, and the excitation light control unit 61 performs a process based on the detected result (EIT signal). As long as the intensity of the EIT signal is equal to or greater than a threshold value, when the intensity of the EIT signal and a preset threshold value are compared to each other, the light receiving circuit 68 of the excitation light control unit 61 transmits a signal showing that the intensity of the EIT signal is equal to or greater than a threshold value, to the digital circuit 66. When the intensity of the EIT signal is equal to or greater than a threshold value, the light receiving circuit 68 of the excitation light control unit 61 constantly transmits the signal showing that the intensity of the EIT signal is equal to or greater than a threshold value, to the digital circuit 66. When the digital circuit 66 receives the signal showing that the intensity of the EIT signal is equal to or greater than a threshold value, the digital circuit determines that the crystal oscillator 13 oscillates at 10 kHz, is released from the sweep circuit 69, and fixes the oscillation frequency of the crystal oscillator 13 to the atomic resonance frequency.

However, the oscillation frequency of the crystal oscillator 13 changes with time for a long time, due to the quartz crystal of the crystal oscillator 13 which degrades with time. Accordingly, in order to fix the oscillation frequency to the atomic resonance frequency, it is necessary to sweep the oscillation frequency of the crystal oscillator 13 by the sweep circuit 69 and to find the frequency for output the EIT signal.

When adjusting the oscillation frequency of the crystal oscillator 13, the excitation light control unit 61 changes the oscillation frequency of the crystal oscillator 13 to a frequency close to 10 kHz by the sweep circuit 69, and transmits the signal showing that the intensity of the EIT signal is equal to or greater than a threshold value to the digital circuit 66, when the intensity of the EIT signal is equal to or greater than a threshold value, by comparing the intensity of the EIT signal and the threshold value to each other as described above. When the digital circuit 66 receives the signal showing that the intensity of the EIT signal is equal to or greater than a threshold value, the digital circuit determines that the crystal oscillator 13 oscillates at 10 kHz, and is released from the sweep circuit 69, and fixes the oscillation frequency of the crystal oscillator 13. Accordingly, a state in which the crystal oscillator 13 oscillates at 10 kHz is maintained.

Power Terminal, Power Circuit, and Boosting Circuit

As shown in FIG. 1 and FIG. 7, the atomic oscillator 1 includes a power terminal 15 which is provided on the first substrate 81 and is electrically connected to a power 16, and a power voltage is applied to the power terminal 15 from the power 16. The power voltage output from the power 16 is applied to predetermined units from the power terminal 15. The power 16 may be embedded in or detachable from the atomic oscillator 1, or may be a power at the outside of the atomic oscillator 1.

The atomic oscillator 1 includes a power circuit 17 which is provided on the first substrate 81 and is electrically connected to the power terminal 15. In the power circuit 17, the power voltage is converted into voltages having various predetermined sizes, and each voltage is applied to predetermined units.

The power terminal 15 and the power circuit 17 are respectively electrically connected to a connector 191 provided on the first substrate 81. The power voltage and the voltage converted by the power circuit 17 are, respectively, applied to each unit provided on the second substrate 82 through the connector 191 and a connector 192 (see FIG. 4) which will be described later, and applied to each unit provided on the third substrate 83 through the connectors 191 and 192 and a connector 193 (see FIG. 4) which will be described later.

Herein, the connector 191 is preferably provided in the vicinity of the power terminal 15. The power circuit 17 is preferably provided in the vicinity of the power terminal 15. The power circuit 17 is preferably provided in the vicinity of the connector 191. Accordingly, it is possible to supply the current to be supplied to the power terminal 15 with a short wire, from the power terminal 15 to each unit provided on the second substrate 82 and each unit provided on the third substrate 83. Therefore, it is possible to decrease power loss.

A fuse may be, for example, respectively provided between the power terminal 15 and the power circuit 17, and between the power terminal 15 and the connector 191.

The atomic oscillator 1 includes a boosting circuit 14 which is provided on the third substrate 83 and increases the voltage applied to the heater 33. The boosting circuit 14 is positioned in the middle of the power line between the power terminal 15 and the heater 33, an input terminal of the boosting circuit 14 is electrically connected to the power terminal 15, and an output terminal of the boosting circuit 14 is electrically connected to the heater 33. Accordingly, the power voltage is increased by the boosting circuit 14 and is applied to the heater 33. Therefore, it is possible to maintain the constant power supplied to the heater 33, and to decrease the current flowing through the heater 33. Thus, it is possible to decrease the magnetic field generated by the current flowing through the heater 33 when electrically connected to the heater 33, and to prevent or suppress a negative effect of the magnetic field on the inside of the gas cell 31.

The boosting circuit 14 is not particularly limited, as long as it can increase the voltage, and preferably has a switching function such as a switching regulator, for example. It is possible to realize high efficiency and low cost by using the boosting circuit having a switching function.

When the boosting circuit having a switching function is used as the boosting circuit 14, a switching frequency is not particularly limited, is appropriately set with the conditions, but is preferably from 10 kHz to 10 MHz, and more preferably from 100 kHz to 3 MHz. Herein, the magnetic field generated by the electrical connection to the heater 33 includes a component dependent to the switching frequency of the boosting circuit 14. Meanwhile, since the light emitting unit 21 is driven by a signal subjected to frequency modulation at a low frequency (for example, approximately 100 Hz) and emits the excitation light LL, the atomic resonance is easily affected with the magnetic field including a frequency component close to the frequency for frequency modulation. Accordingly, the switching frequency is preferably separated from the frequency for frequency modulation. Therefore, when the switching frequency is lower than the lower limit value, the magnetic field generated by the electric connection to the heater 33 negatively affects the atomic resonance, depending on the other conditions. When the switching frequency is close to an output frequency, the atomic resonance is negatively affected, for example, by generating noise.

An amplification factor of the voltage of the boosting circuit 14 is not particularly limited and is appropriately set with the conditions, but is preferably from 2 times to 5 times, and more preferably from 3 times to 4.5 times. The amplification factor of the voltage is a value obtained by dividing the amplified voltage by the voltage before the amplification. When the amplification factor of the voltage is less than the lower limit value, the magnetic field generated by the electrical connection to the heater 33 may become excessively large, depending on the other conditions. When the amplification factor of the voltage is greater than the upper value, a high-voltage member is necessary, a size of a device may increase, the cost may increase, or more noise may be generated, depending on the other conditions.

The current supplied to the heater 33 is not particularly limited and is appropriately set with the conditions, but is preferably equal to or smaller than 1.5 A, more preferably equal to or smaller than 300 mA, and even more preferably from 1 mA to 300 mA. The voltage applied to the heater 33 is not particularly limited and is appropriately set with the conditions, but is preferably from 6 V to 15 V, and more preferably from 8 V to 14 V.

The output terminal of the boosting circuit 14 is not electrically connected to the other portions such as the light emitting unit 21, the light receiving unit 38, the excitation light control unit 61, the cell temperature control unit 62, the light emitting unit temperature control unit 64, and the package temperature control unit 65. That is, the boosting circuit 14 is used to be dedicated to the heater 33. Accordingly, it is possible to freely set each parameter of the boosting circuit 14 so as to be optimal with respect to the heater 33.

The effects of providing the boosting circuit 14 are as follows.

First, it is possible to decrease the power consumption by decreasing the power voltage. By increasing the power to be applied to the heater 33 by the boosting circuit 14, it is possible to maintain the constant power supplied to the heater 33, to decrease the current flowing through the heater 33, and accordingly, it is possible to decrease the magnetic field generated by the heater 33 by the electrical connection to the heater 33. Therefore, it is possible to prevent or suppress the negative effect of the magnetic field generated by the heater 33 on the inside of the gas cell 31, to stabilize the magnetic field generated in the internal space S of the gas cell 31, and to improve the accuracy of the oscillation frequency of the atomic oscillator 1. In addition, it is possible to simplify the magnetic shield.

First Substrate, Second Substrate, and Third Substrate

Hereinafter, the first substrate 81, the second substrate 82, and the third substrate 83 will be described based on FIGS. 1, 4, 6, and 7.

The first substrate 81, the second substrate 82, and the third substrate 83 have wires (not shown), and have a function of electrically connecting each electronic component of the control unit 6 separately mounted on the first substrate 81, the second substrate 82, and the third substrate 83, and each connector (not shown) through the wires. Each connector is a member which electrically connects the first unit 2 and the second unit 3, and the first substrate 81, the second substrate 82, and the third substrate 83 to each other.

Various printed circuit boards can be used as the first substrate 81, the second substrate 82, and the third substrate 83, and a substrate including a rigid portion, for example, a rigid substrate or a rigid flexible substrate is preferably used.

The control unit 6 is separately installed on one surface (surface on the upper side in FIG. 4) of the first substrate 81, the second substrate 82, and the third substrate 83.

That is, the power circuit 17, the excitation light control unit 61 including the high frequency current generation unit 610, the analog circuit 67 including the light receiving circuit 68, and the bias current generation unit 56 are installed on the first substrate 81. The power terminal 15 electrically connected to the power 16, the power circuit 17 electrically connected to the power terminal 15, and the connectors 194 and 195 are installed on the first substrate 81.

The light emitting unit temperature control unit 64, the cell temperature control unit 62, and the digital circuit 66 are installed on the second substrate 82.

The boosting circuit 14 and the package temperature control unit 65 are installed on the third substrate 83. The boosting circuit 14 is installed on the third substrate 83.

Herein, when the relative sizes of the current flowing through each circuit (each unit) provided on the first substrate 81, the second substrate 82, and the third substrate 83 are divided into three stages of "large", "medium", and "small", the size of the current flowing through each circuit of the first substrate 81 is set to "small", the size of the current flowing through each circuit of the second substrate 82 is set to "medium", and the size of the current flowing through each circuit of the third substrate 83 is set to "large". As described above, it is possible to decrease interference between each circuit, by dividing the substrates by the size of the current (or size of the frequency). Therefore, it is possible to reliably detect the minute EIT signal, and to provide the atomic oscillator 1 with high accuracy.

As shown in FIGS. 4 and 6, the shape of the first substrate 81, the second substrate 82, and the third substrate 83 is not particularly limited, and is a rectangle, in the embodiment.

The dimension of the first substrate 81, the second substrate 82, and the third substrate 83 is not particularly limited. In the embodiment, the size of the first substrate 81 is largest, and the second substrate 82 and the third substrate 83 have the same size as each other.

An opening 811 is formed on a portion of the first substrate 81 where the second substrate 82 and the third substrate 83 are not positioned. The first unit 2 and the second unit 3 are disposed in the opening 811.

The first substrate 81, the second substrate 82, and the third substrate 83 are arranged along a thickness direction thereof at predetermined intervals. In this case, the first substrate 81, the second substrate 82, and the third substrate 83 are disposed in this order from the lower side to the upper side in the drawing, the first substrate 81 and the second substrate 82 are separated from each other, and the second substrate 82 and the third substrate 83 are separated from each other. That is, at least some parts of the first substrate 81, the second substrate 82, and the third substrate 83 are overlapped with each other, when seen from the thickness direction, that is, in a plan view. In the configuration shown in the drawing, the entire second substrate 82 is overlapped with the first substrate 81 in a plan view, the entire third substrate 83 is overlapped with the first substrate 81 in a plan view, and the entirety of the second substrate 82 and the third substrate 83 are overlapped with each other in a plan view. Therefore, it is possible to miniaturize the atomic oscillator 1.

The connector (first connection terminal) 191 electrically connected to the wire of the first substrate 81 is installed on the first substrate 81, the connector (second connection terminal) 192 electrically connected to the wire of the second substrate 82 is installed on the second substrate 82, and the connector (third connection terminal) 193 electrically connected to the wire of the third substrate 83 is installed on the third substrate 83. The connector 191 and the connector 192 are detachably connected to each other, and the connector 191 and the connector 192 are electrically connected to each other, in a state of being connected to each other. In the same manner as described above, the connector 192 and the connector 193 are detachably connected to each other, and the connector 192 and the connector 193 are also electrically connected to each other, in a state of being connected to each other. Accordingly, in a state where the connector 191 and the connector 192 are connected to each other and the connector 192 and the connector 193 are connected to each other, the first substrate 81, the second substrate 82, and the third substrate 83 are electrically connected to each other.

The connector 191, the connector 192, and the connector 193 are overlapped with each other, when seen from the thickness direction of the first substrate 81, the second substrate 82, and the third substrate 83, that is, in a plan view. Accordingly, it is possible to supply the current to be supplied to the power terminal 15 with a short wire, from the power terminal 15 to each unit provided on the second substrate 82 and each unit provided on the third substrate 83, through the connectors 191, 192, and 193. Therefore, it is possible to decrease power loss.

The order of the first substrate 81, the second substrate 82, and the third substrate 83 is not limited to the order described above, and the order thereof may be set as the order of the first substrate 81, the third substrate 83, and the second substrate 82, the order of the third substrate 83, the first substrate 81, and the second substrate 82, the order of the third substrate 83, the second substrate 82, and the first substrate 81, the order of the second substrate 82, the first substrate 81, and the third substrate 83, and the order of the second substrate 82, the third substrate 83, and the first substrate 81, from the lower side to the upper side in FIGS. 4 and 6.

Other electronic components than the components described above may be mounted on the first substrate 81, the second substrate 82, and the third substrate 83.

Position Relationship of Each Unit Installed on First Substrate

As shown in FIG. 7, first, the light emitting unit 21, the gas cell 31, and the light receiving unit 38 are arranged in the X axis direction, the light emitting unit 21 is disposed on the positive side of the gas cell 31 in the X axis direction, and the light receiving unit 38 is disposed on the negative side of the gas cell 31 in the X axis direction.

The light receiving circuit 68 and the connector 195 are disposed on the negative side of the light receiving unit 38 in the X axis direction. The light receiving circuit 68 and the connector 195 are arranged in the X axis direction with the light emitting unit 21, the gas cell 31, and the light receiving unit 38, and are disposed in the order of the light receiving circuit 68 and the connector 195, to the negative side in the X axis direction. The connector 195 is disposed in a range in the vicinity of the light receiving unit 38 and the light receiving circuit 68, and in the Y axis direction of the second unit 3.

The bias current generation unit 56 and the connector 194 are disposed on the positive side in the X axis direction of the light emitting unit 21. The bias current generation unit 56 and the connector 194 are arranged in the X axis direction (direction in which the gas cell 31 and the light emitting unit 21 are arranged) with the light emitting unit 21, the gas cell 31, and the light receiving unit 38, and are disposed in the order of the connector 194 and the bias current generation unit 56, to the positive side in the X axis direction. Accordingly, the light emitting unit 21, the gas cell 31, the light receiving unit 38, and the light receiving circuit 68 are disposed between the connector 195 and the connector 194.

The high frequency current generation unit 610 is arranged in the Y axis direction with the gas cell 31, the light emitting unit 21, and the connector 194, and are disposed on the negative side in the Y axis direction of the gas cell 31, the light emitting unit 21, and the connector 194. That is, the high frequency current generation unit 610 is deviated from a linear line 95 connecting the center of the gas cell 31 and the center of the light emitting unit 21. Accordingly, it is possible to decrease the dimension of the device in the direction of the linear line 95 (X axis direction) and to realize miniaturization, compared to a case where the high frequency current generation unit 610 is disposed on the linear line 95.

The connector 194 is disposed in a range in the vicinity of the light emitting unit 21, the bias current generation unit 56, and the high frequency current generation unit 610, and in the Y axis direction of the second unit 3.

The connector 194 is disposed on the light emitting unit 21 side with respect to the high frequency current generation unit 610.

The dimension of the first substrate 81 is not particularly limited and is appropriately set with the conditions, but one length of the first substrate 81 is preferably equal to or smaller than 100 mm, and more preferably from 5 mm to 70 mm. Therefore, it is possible to provide the small-sized atomic oscillator 1.

A length L1 of the wire 91 between the connector 194 and an output terminal of the high frequency current generation unit 610 is not particularly limited and is appropriately set with the conditions, but is preferably equal to or smaller than 5 mm, and more preferably from 0.5 mm to 3 mm. When the L1 is greater than the upper limit value, an attenuation amount of the high frequency current may increase, depending on the other conditions.

A length L2 of the wire 92 between the connector 194 and an output terminal of the bias current generation unit 56 is not particularly limited and is appropriately set with the conditions, but is preferably equal to or smaller than 5 mm, and more preferably from 0.5 mm to 3 mm. When the L2 is greater than the upper limit value, an amount of the noise mixed with the bias current may increase, depending on the other conditions.

A length L3 of the wire 93 between the connector 195 and an output terminal of the light receiving circuit 68 is not particularly limited and is appropriately set with the conditions, but is preferably equal to or smaller than 5 mm, and more preferably from 0.5 mm to 3 mm. When the L3 is greater than the upper limit value, an amount of the noise mixed with the light receiving signal may increase, depending on the other conditions.

As described above, according to the atomic oscillator 1, by employing the disposition and the dimension described above, it is possible to decrease the length of the wire between the connector 195 and the light receiving unit 38 and to decrease the length of the wire between the light receiving circuit 68 and the light receiving unit 38, and therefore it is possible to decrease the amount of the noise mixed with the light receiving signal. In addition, it is possible to decrease the length of the wire between the connector 194 and the light emitting unit 21 and to decrease the length of the wire between the high frequency current generation unit 610 and the light emitting unit 21, and therefore it is possible to decrease the attenuation amount of the high frequency current. Further, it is possible to decrease the length of the wire between the bias current generation unit 56 and the light emitting unit 21, and it is possible to decrease the amount of the noise mixed with the bias current. Accordingly, it is possible to improve an SN ratio of the EIT signal, and to reliably detect the EIT signal. Therefore, it is possible to provide the atomic oscillator 1 with high accuracy.

By employing the disposition and the dimension described above, it is possible to miniaturize the atomic oscillator 1.

2. Electronic Device

The atomic oscillator described above can be introduced to various electronic devices. Such electronic devices have excellent reliability.

Hereinafter, the electronic device according to the invention will be described.

Figure 8:
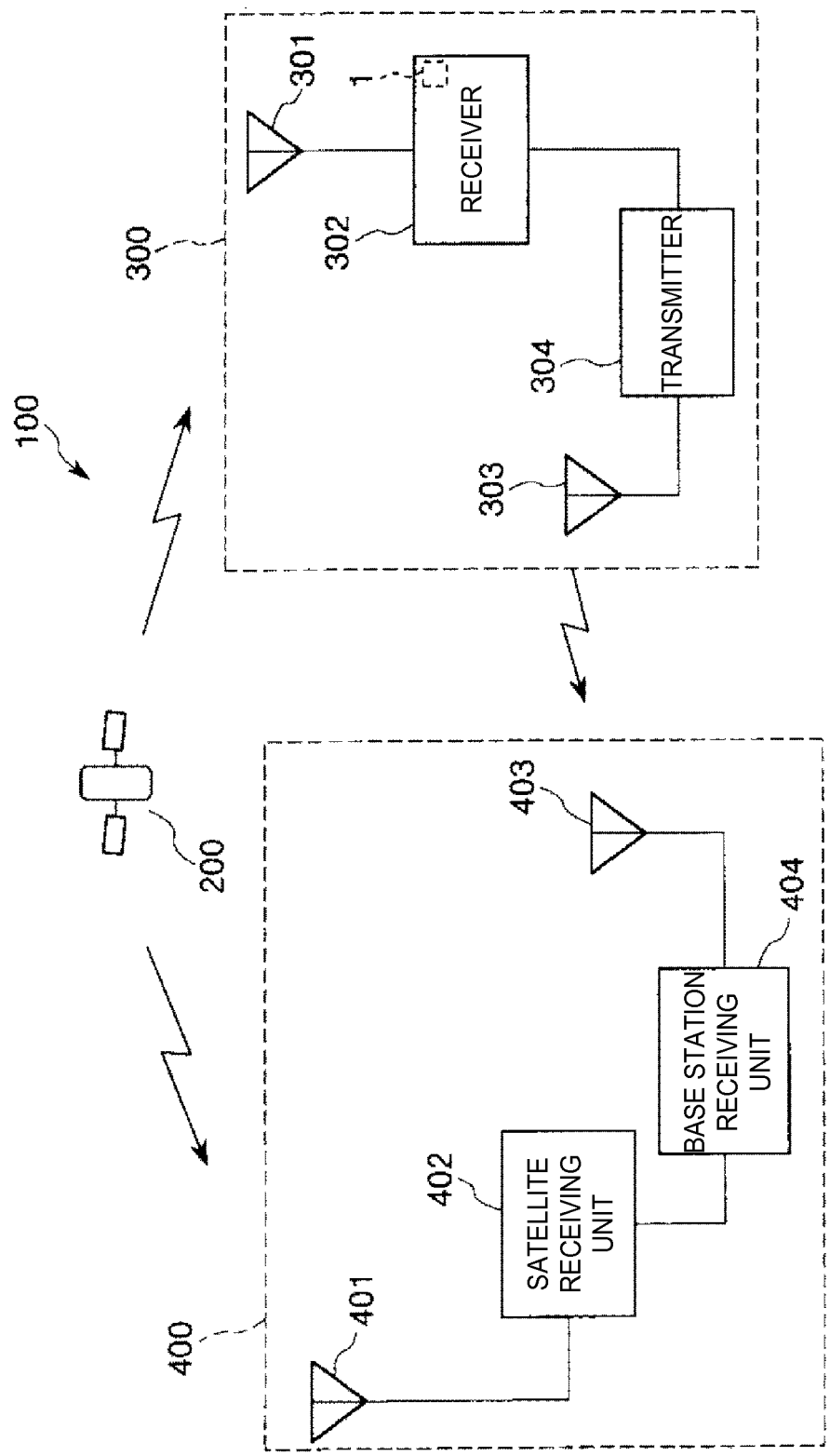
FIG. 8 is a schematic view of a system configuration when an atomic oscillator according to the invention is used in a positioning system using a GPS satellite.

FIG. 8 is a schematic view of a system configuration when the atomic oscillator according to the invention is used in a positioning system using a GPS satellite.

A positioning system 100 shown in FIG. 8 is configured with a GPS satellite 200, a base station device 300, and a GPS receiver 400.

The GPS satellite 200 transmits positioning information (GPS signal).

The base station device 300, for example, includes a receiver 302 which receives the positioning information from the GPS satellite 200 through an antenna 301 installed at an electronic reference point (GPS continuous observation station) with high accuracy, and a transmitter 304 which transmits the positioning information received by the receiver 302 through an antenna 303.

Herein, the receiver 302 is an electronic device including the atomic oscillator 1 according to the invention described above, as a reference frequency oscillation source. The receiver 302 has excellent reliability. The positioning information received by the receiver 302 is transmitted by the transmitter 304 in real time.

The GPS receiver 400 includes a satellite receiving unit 402 which receives the positioning information from the GPS satellite 200 through an antenna 401, and a base station receiving unit 404 which receives the positioning information from the base station device 300 through an antenna 403.

3. Moving Object

Figure 9:
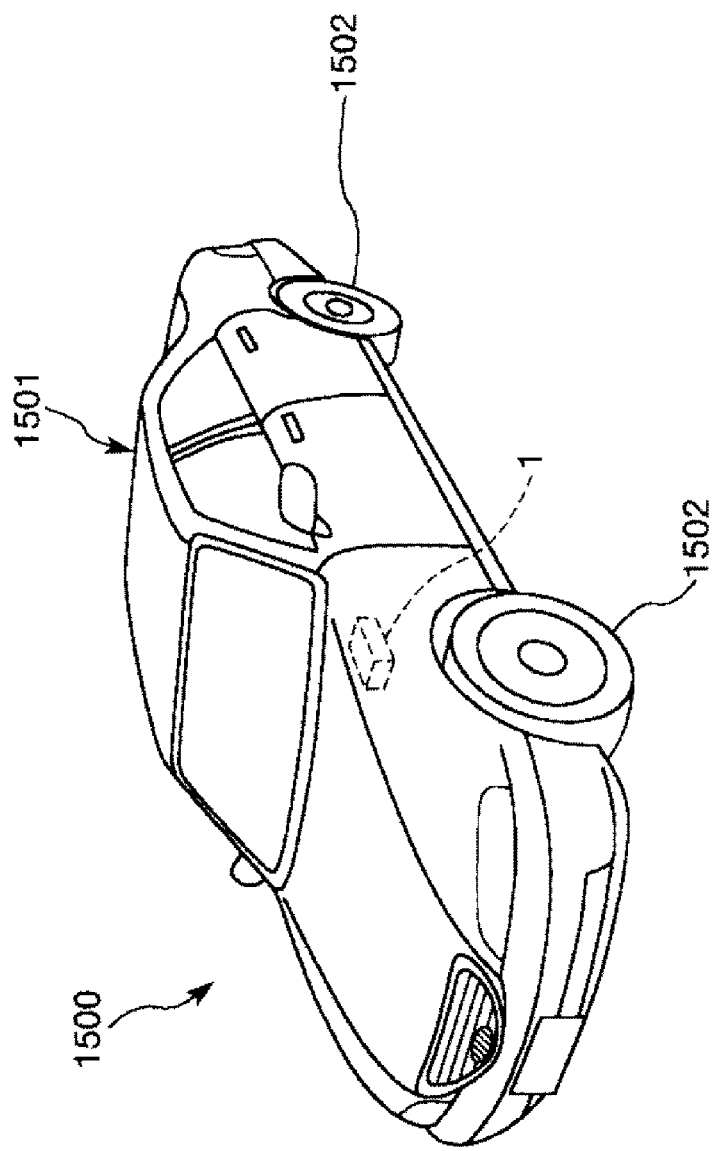
FIG. 9 is a diagram showing an example of a moving object according to the invention.

FIG. 9 is a diagram showing an example of a moving object according to the invention.

In this drawing, a moving object 1500 includes a car body 1501 and four wheels 1502, and is configured so as to rotate the wheels 1502 with a power source (engine, not shown) provided on the car body 1501. The atomic oscillator 1 is embedded in the moving object 1500.

According to the moving object, it is possible to exhibit excellent reliability.

The electronic device including the atomic oscillator according to the invention (quantum interference device according to the invention) is not particularly limited to the above, and examples thereof include a mobile phone, a digital still camera, an ink jet type discharging apparatus (for example, ink jet printer), a personal computer (a mobile-type personal computer or a laptop-type personal computer), a television, a video camera, a video recorder, a car navigation apparatus, a pager, an electronic organizer (including a communication function), an electronic dictionary, a calculator, an electronic game device, a word processer, a work station, a video phone, a security monitor, electronic binoculars, a POS terminal, medical equipment (for example, an electronic thermometer, a blood pressure meter, a blood glucose meter, an ECG measuring device, a ultrasound diagnostic device, and an electronic endoscope), a fish finder, a variety of measurement equipment, a meter (for example, meters for vehicles, aircraft, and ships), a flight simulator, terrestrial digital broadcasting, a mobile phone base station, and the like.

Hereinabove, the quantum interference device, the atomic oscillator, the electronic device, and the moving object according to the invention have been described based on the embodiments shown in the drawing, but the invention is not limited thereto.

In the quantum interference device, the atomic oscillator, the electronic device, and the moving object according to the invention, the configuration of each unit can be replaced with the arbitrary configuration which exhibits the same functions, or the arbitrary configuration can be added thereto.

In the invention, the arbitrary configurations of the embodiments described above may be combined with each other.

In the invention, the structure of the atomic oscillator (quantum interference device) is not limited to the configuration of the embodiments described above.

For example, in the embodiments described above, the structure in which the gas cell is disposed between the light emitting unit and the light receiving unit has been described as an example, but there is no limitation, and the light emitting unit and the light receiving unit may be disposed on the same side with respect to the gas cell, and the light reflected by a surface on the side opposite to the light emitting unit and the light receiving unit of the gas cell, or by a mirror provided on the side opposite to the light emitting unit and the light receiving unit of the gas cell may be detected by the light receiving unit.

In the embodiments described above, three substrates of the first substrate, the second substrate, and the third substrate are provided as the substrates including the wires, but there is no limitation, and the number of the substrates may be one, two, or four or more.

In the embodiments described above, the structure in which the first unit and the second unit are installed on the base plate of the external package has been described as an example, but there is no limitation, and the first unit and the second unit may be installed on the first substrate, for example.

In the embodiments described above, the atomic oscillator using the quantum interference effect with two kinds of light beams having different wavelengths has been described as an example, but there is no limitation, and an atomic oscillator using a double resonance phenomenon with light or microwaves may be used.

The entire disclosure of Japanese Patent Application No. 2013-263492, filed Dec. 20, 2013 is expressly incorporated by reference herein.

What is claimed is:

1. A quantum interference device comprising:
a gas cell in which metal atoms are sealed;
a light emitting unit which emits light to the gas cell;
a light receiving unit which receives the light penetrating the gas cell and outputs a light receiving signal;
an input unit which inputs the light receiving signal;
a light receiving circuit which processes the light receiving signal output from the input unit;
a high frequency current generation unit which is arranged with the light emitting unit in a line, and generates high frequency current; and
a first output unit which outputs the high frequency current output from the high frequency current generation unit to the light emitting unit,
wherein the gas cell is disposed between the input unit and the first output unit.

2. The quantum interference device according to claim 1, further comprising:
a bias current generation unit which is arranged with the light emitting unit in a line, and generates bias current to be supplied to the light emitting unit; and
a second output unit which outputs the bias current output from the bias current generation unit to the light emitting unit,
wherein the gas cell is disposed between the input unit and the second output unit.

3. The quantum interference device according to claim 1, wherein the high frequency current generation unit is deviated from a linear line connecting the gas cell and the light emitting unit.

4. The quantum interference device according to claim 1, wherein the high frequency current generation unit and the gas cell are arranged in a line.

5. The quantum interference device according to claim 1, wherein the first output unit is arranged in a direction in which the gas cell and the light emitting unit are arranged in a line, and is disposed on the light emitting unit side with respect to the high frequency current generation unit.

6. An atomic oscillator comprising the quantum interference device according to claim 1.

7. An electronic device comprising the quantum interference device according to claim 1.

8. A moving object comprising the quantum interference device according to claim 1.

* * * * *